(12) United States Patent
Chen et al.

(10) Patent No.: US 7,397,717 B2
(45) Date of Patent: Jul. 8, 2008

(54) SERIAL PERIPHERAL INTERFACE MEMORY DEVICE WITH AN ACCELERATED PARALLEL MODE

(75) Inventors: Han-Sung Chen, Hsinchu (TW); Chia-Yen Yeh, Tainan (TW); Chen-Hao Po, Sijhih (TW); Ching-Chung Lin, Banciao (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/137,503

(22) Filed: May 26, 2005

(65) Prior Publication Data

US 2006/0268642 A1  Nov. 30, 2006

(51) Int. Cl.
*G11C 7/10* (2006.01)
(52) U.S. Cl. .................. 365/221; 365/220; 365/219; 365/189.05; 365/233.19; 365/233.1; 365/51; 365/63; 365/185.33; 711/103

(58) Field of Classification Search ............... 365/219, 365/220, 221, 233, 185.33, 51, 63, 189.05, 365/233.19, 233.1; 711/103
See application file for complete search history.

(56) References Cited

U.S. PATENT DOCUMENTS

| 5,966,723 A | * | 10/1999 | James et al. ............... 711/103 |
| 2006/0067123 A1 | * | 3/2006 | Jigour et al. ........... 365/185.05 |
| 2006/0143366 A1 | * | 6/2006 | Yang et al. .................. 711/103 |

* cited by examiner

*Primary Examiner*—Andrew Q Tran
(74) *Attorney, Agent, or Firm*—Finnegan, Henderson, Farabow, Garrett & Dunner LLP

(57) ABSTRACT

A serial peripheral flash memory device uses a plurality of dummy input/output terminals to enable the selection of a parallel mode for devices that have a slower serial clock speed. In parallel mode, data is transmitted over the plurality of dummy input/output terminals to allow a plurality of bits to be transmitted at the same time improving the data transmission rate at the slower serial clock speed.

12 Claims, 8 Drawing Sheets

SERIAL PERIPHERAL INTERFACE MEMORY DEVICE WITH AN ACCELERATED PARALLEL MODE

DESCRIPTION OF THE INVENTION

1. Field of the Invention

The invention relates to nonvolatile memory devices that utilize a serial peripheral interface (SPI) for the serial transmission of data.

2. Background

A serial peripheral interface (SPI) has been utilized in the past for enabling the serial exchange of data between two devices, one referred to as the master and the other referred to as the slave. Serially exchanging data involves transmitting data between the master and slave devices one bit at a time, and is often used in computer systems for transmitting data between the central processing unit (CPU) and various peripheral devices. In such a case, the CPU acts as the master device and the peripherals are the slave devices. The bit-by-bit transmission of data is limited by the speed of the serial clock rate of the master device, so that if the serial clock rate is low, large amounts of data will be transmitted very slowly.

Another means of transmitting data is through a parallel interface. Exchanging data in parallel involves transmitting a plurality of bits over a plurality of transmission paths simultaneously. Parallel transmission has the advantage of allowing more bits to be transmitted over a given time, and thus a faster transmission rate. However, parallel transmission between devices suffers from the drawbacks of often having complicated connection schemes, and often needing short transmission paths to minimize crosstalk between transmission paths.

Nonvolatile memory devices, including flash memory devices, have traditionally transmitted data using a parallel interface. Recently, however, the serial peripheral interface has been implemented in flash memory designs. Flash memory devices using the serial peripheral interface are less complex, and can be made on a much smaller scale, needing only an input terminal, an output terminal, a clock input terminal, a chip select terminal, and an applied voltage to be able to program and read data.

FIG. 1 is a diagram of a conventional serial peripheral interface flash memory device 100. Flash memory device 100 is a 16-terminal small outline package (SOP) chip, but may be provided in other forms, having greater or fewer terminals (pins). Device 100 includes a hold signal terminal 102, an input voltage terminal 104, an additional voltage terminal 106, and a ground terminal 108. The serial peripheral interface terminals of device 100 include a chip select input terminal 110, an output terminal 112, a clock signal input terminal 114, and an input terminal 116. The remaining terminals are dummy terminals 118 which, regardless of the size of memory device 100, are not connected to any internal memory parts.

FIG. 2 is a block diagram illustrating the operation of conventional serial peripheral interface flash memory device 100. Device 100 includes control logic 202 that is connected to receive chip select signal CS on input terminal 110 and a serial clock signal SCLK on input terminal 114. Data is input through a serial input SI on input terminal 116 into an input/output shift register 204 and loaded into a data buffer 206 for temporary storage prior to writing into a memory array 208. A write address, supplied by an address register 210, corresponds to a physical location in memory array 208. The position of the write address in memory array 208 is decoded by an X-decoder 212 and a Y-decoder 214. A status register 216 supplies an indication of the current status of serial peripheral interface flash memory device 200. Data input through serial input SI may comprise an operation command which is supplied to control logic 202. In response, control logic 202 interprets the command to determine if a read, erase, or program operation should be performed. If control logic 202 determines that the operation requires a high voltage, e.g., for a write operation, a signal is sent to a high voltage generator 218 to initiate the high voltage operation. If the operation is a data read operation, which does not require a high voltage, Y-decoder 214 and X-decoder 212 determine the location of the data to be read in memory array 208. In performing the read operation, the data read from memory array 208 is output to data buffer 206. The data is then transmitted from data buffer 206 to input/output shift register 204 which outputs the data through output terminal 112 at a frequency of one bit per cycle of serial clock signal SCLK. Regardless of the operation, data will be input or output at a frequency of one bit per cycle of serial clock signal SCLK.

FIG. 3 shows a set of timing waveforms 300 associated with a write operation of a conventional serial peripheral interface flash memory device such as device 100. For the programming of N-bytes, bits are input through serial input (SI) terminal 116. The bits are transmitted at a rate of one bit per cycle of serial clock signal SCLK into data buffer 206. The input bits are stored in data buffer 206 until the chip select signal CS goes high. After the chip select signal CS goes high, the data stored in data buffer 206 is transmitted to memory array 208. The write timing is synchronized with the serial clock signal SCLK. If a serial flash memory device has a slow clock signal, the device will have slow write performance. Serial flash memory devices can have a fast clock signal, e.g., between 25-50 MHz. Many users, however, have older, or lower-cost systems, which may have a slower clock signal, e.g., between 1-5 MHz.

SUMMARY OF THE INVENTION

In accordance with the invention, there is provided a method of operating a serial peripheral interface flash memory device, comprising applying a parallel mode command to a first pin operatively coupled to an input/output interface of the memory device to cause the device to operate in a parallel data transmission mode; applying a chip select signal to a second pin of the memory device to enable operation in response to the parallel mode command; applying a serial clock signal to a third pin of the memory device; applying one of a read command and a write command to the first pin; and transmitting data in parallel on a fourth pin and additional pins, operatively coupled to the input/output interface, at a frequency corresponding to the serial clock signal, wherein data is transmitted only on the fourth pin and at the frequency when the device operates in a serial mode.

Also in accordance with the invention, there is provided a semiconductor memory device comprising an input/output interface; a serial data transmission input terminal, operably coupled to the input/output interface, for receiving a parallel mode command; a clock signal input terminal for receiving a serial clock signal; a serial data transmission terminal, operably coupled to the input/output interface, for serving as a sole data transmission pin in a serial mode for serially transmitting data at a frequency determined by the serial clock signal; a chip select input terminal for receiving a chip select signal to enable operation in response to the parallel mode command; a plurality of dummy input/output terminals, operably connected in parallel to the input/output interface, for transmitting data in the parallel mode in parallel with data being transmitted on the serial data terminal at the frequency determined by the serial clock signal.

Further in accordance with the invention, there is provided a serial peripheral interface flash memory integrated circuit device comprising a serial data transmission input terminal, for receiving a data or command input; a clock signal input terminal for receiving a serial clock signal; a serial data transmission terminal, for serving as a sole data transmission pin in a serial mode for serially transmitting data at a frequency determined by the serial clock signal; a chip select input terminal for receiving a chip select signal; at least one voltage input terminal for receiving an applied voltage; a ground terminal for grounding the device; and a plurality of dummy input/output terminals for transmitting data in a parallel mode in parallel with data being transmitted on the serial data terminal at the frequency determined by the serial clock signal.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DESCRIPTION OF THE EMBODIMENTS

Reference will now be made in detail to present embodiments of the invention, an example of which is illustrated in the accompanying drawings. Wherever possible, the same reference numbers will be used throughout the drawings to refer to the same or like parts.

Figure 1:
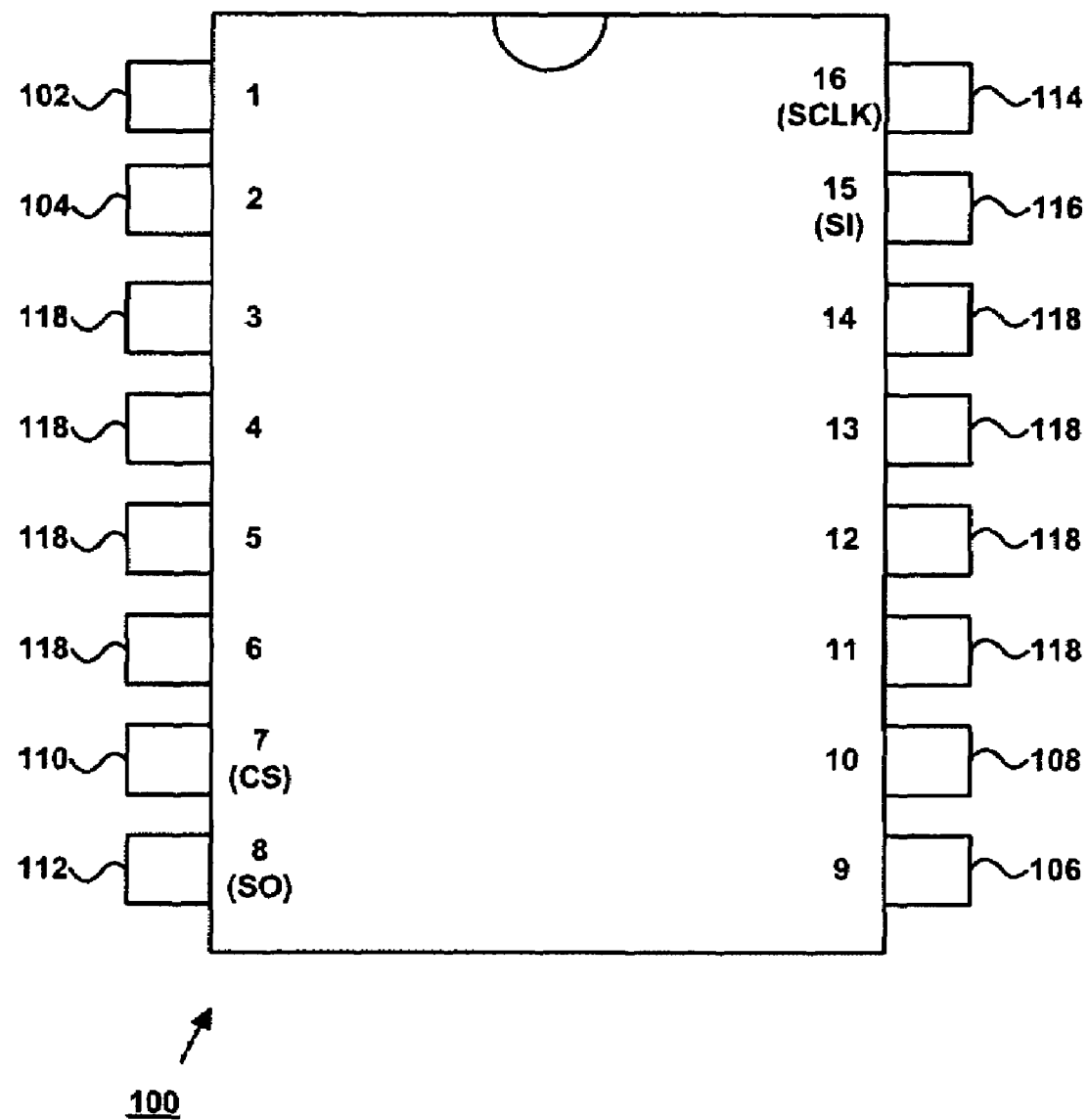
FIG. 1 is a diagram of a conventional serial peripheral interface flash memory device.
Figure 2:
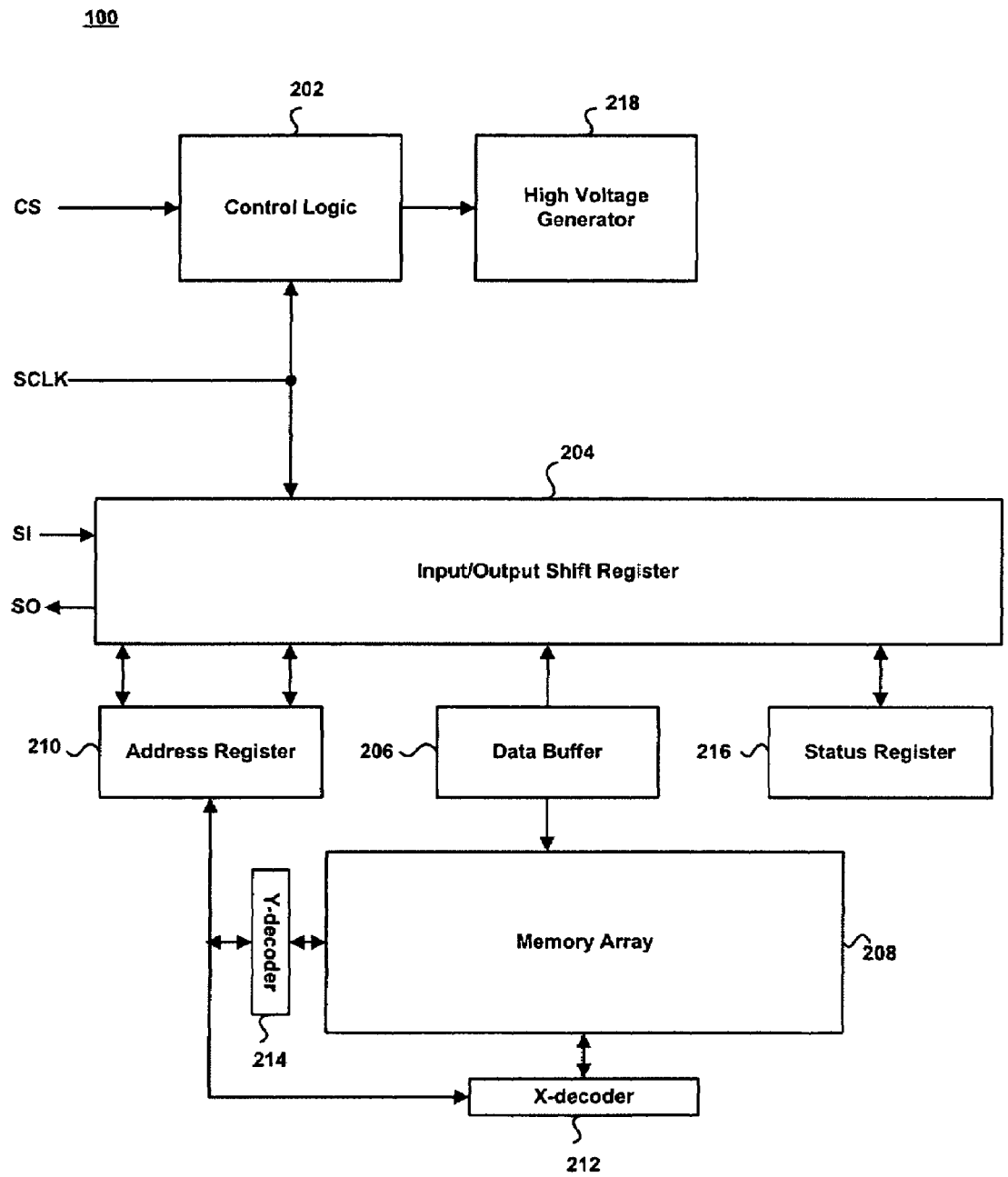
FIG. 2 is a block diagram illustrating the operation of the conventional serial peripheral interface flash memory device shown in FIG. 1.
Figure 3:
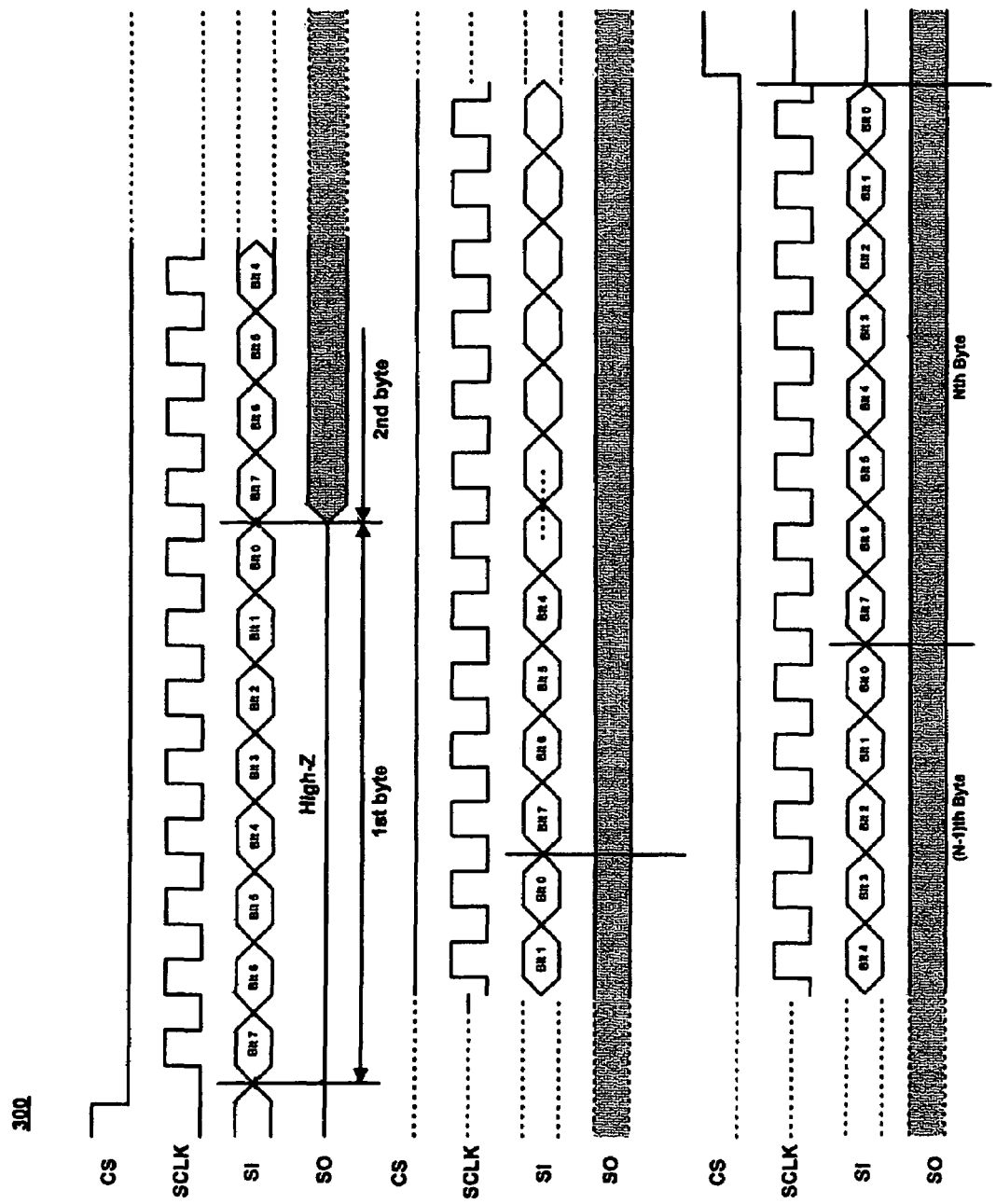
FIG. 3 shows a set of timing waveforms associated with a writing operation of a conventional serial flash memory device such as shown in FIG. 1.
Figure 4:
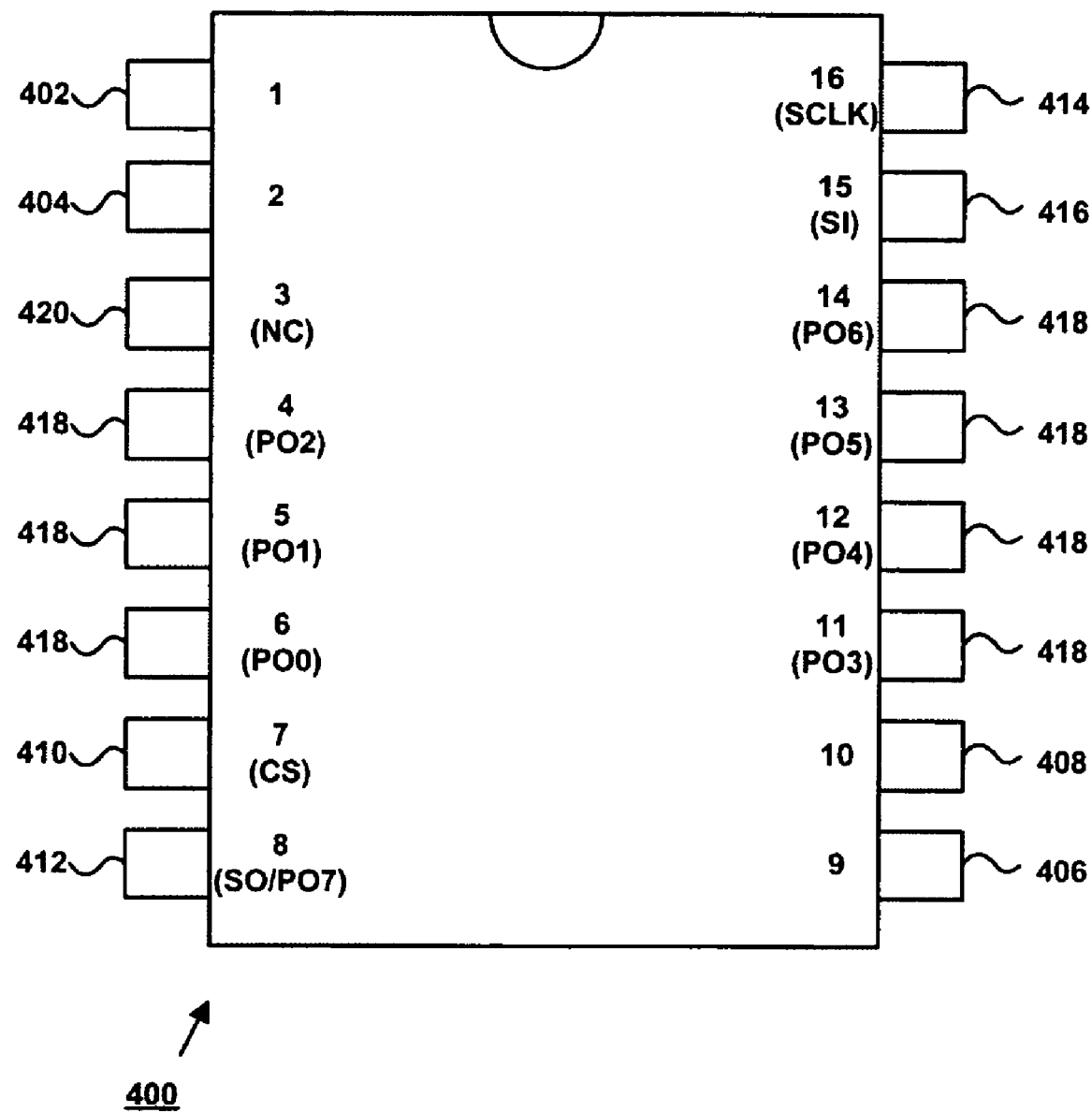
FIG. 4 is a diagram of a serial flash memory device consistent with an embodiment of the present invention.

In accordance with embodiments consistent with the present invention, there is provided a serial peripheral interface flash memory device that includes an accelerated parallel mode that enables higher performance on lower clock frequency systems. FIG. 4 is a diagram of a serial peripheral interface flash memory device 400 consistent with an embodiment of the present invention. Serial flash memory device 400 is a 16-terminal small outline package (SOP) chip, but may be embodied in another form, having greater or fewer terminals (pins). Device 400 includes a hold signal terminal 402, an input voltage terminal 404, an additional voltage terminal 406, and a ground terminal 408. The serial peripheral interface terminals of device 400 include a chip select (CS) input terminal 410, a serial output (SO) terminal 412, a serial clock signal (SCLK) input terminal 414, and a serial input (SI) terminal 416. Serial peripheral interface flash memory device 400 further includes a plurality of dummy terminals 418 that are operably connected to an input/output shift register of serial peripheral interface flash memory device 400, and can be used to transmit data in parallel. Dummy terminal 420 is not operably connected (NC) to any functional units of serial peripheral interface flash memory device 400. Dummy input/output terminals 418 and output terminal 412 together comprise parallel input/output terminals (PO0-PO7) of serial peripheral interface flash memory device 400.

Figure 5:
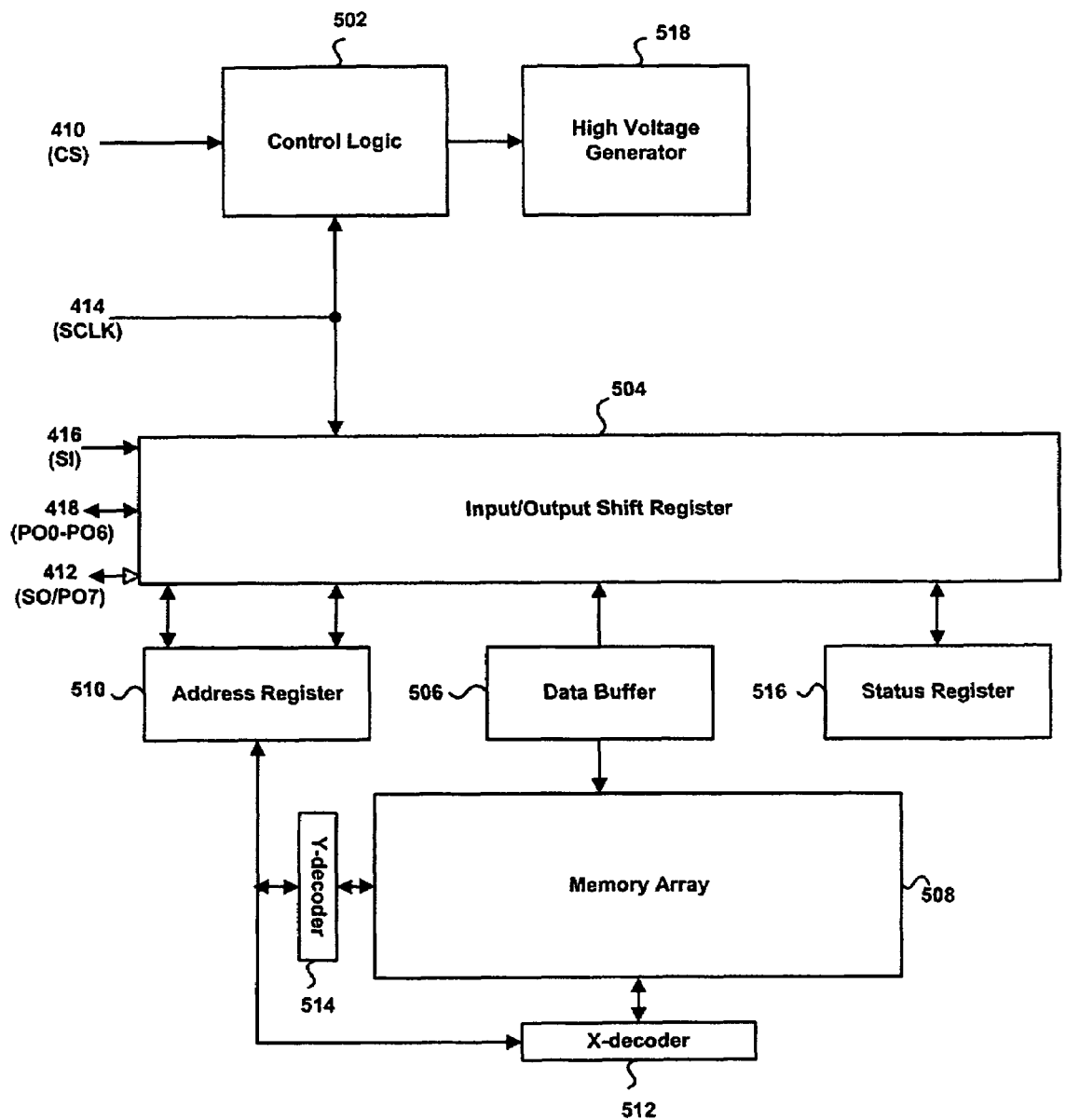
FIG. 5 is a block diagram illustrating the operation of the serial flash memory device consistent with the present invention shown in FIG. 4.

FIG. 5 is a block diagram illustrating the functional units of serial peripheral interface flash memory device 400 consistent with an embodiment of the present invention. Control logic 502 is operably connected to receive a chip select signal CS on CS input terminal 410 and a serial clock signal SCLK on SCLK input terminal 414. Data and commands may be input through serial input (SI) terminal 416, and data may be output through serial output (SO) terminal 412 when device is operating in a serial mode. When serial peripheral interface flash memory device 400 is operating in a parallel mode, data may also be input or output through dummy input/output terminals 418 and serial output terminal 412.

Data is input into, and output from, an input/output shift register 504 that is operably connected to a data buffer 506, used for the temporary storage of data being read from or written to a memory array 508. A write address corresponding to a physical location in memory array 508, may be supplied through an address register 510. The position of the write address in memory array 508 is decoded by an X-decoder 512 and a Y-decoder 514. A status register 516 supplies an indication of the current status of serial peripheral interface flash memory device 400.

Commands input through serial input terminal 416 may include an operation command which is transferred from shift register 504 to control logic 502. Upon receipt, control logic 502 interprets the command to determine if a read, erase, or write operation should be performed. Additionally, the received command may indicate whether a read or write operation will be performed in serial mode or parallel mode.

If control logic 502 determines that the operation requires a high voltage, e.g., for a write operation, a signal will be sent to a high voltage generator 518 to facilitate the high voltage operation. In performing the write operation in serial mode, data is input through serial input terminal 416 into input/output shift register 504 and loaded into data buffer 506 for temporary storage prior to writing to memory array 508. The write address of the data is supplied through address register 510. The supplied write address corresponds to a physical location in memory array 508. The physical location of the write address in memory array 508 is decoded by X-decoder 512 and Y-decoder 514. The data is then written to the corresponding write address in memory array 508. In serial mode, the data is input through serial input terminal 416 at a rate of one bit per cycle of serial clock signal SCLK.

If the write operation is performed in parallel mode, the data is input through parallel input/output terminals PO0-PO7, consisting of dummy input/output terminals 418 and serial output terminal 412, at a rate of eight bits (one byte) per cycle of serial clock signal SCLK.

If the operation is a data read operation, which does not require a high voltage, X-decoder 512 and Y-decoder 514 determine the location of the data to be read from memory array 508. In performing the read operation, the data read from memory array 508 is output to data buffer 506. The data is then transferred from data buffer 506 to input/output shift register 504. In serial mode, data is output from shift register 504 through serial output terminal 412 at a frequency of one bit per cycle of serial clock signal SCLK. If, however, device 400 is operating in parallel mode, data is output from shift register 504 through dummy input/output terminals 418 and serial output terminal 412 at a frequency of eight bits (one byte) per cycle of serial clock signal SCLK.

Figure 6A:
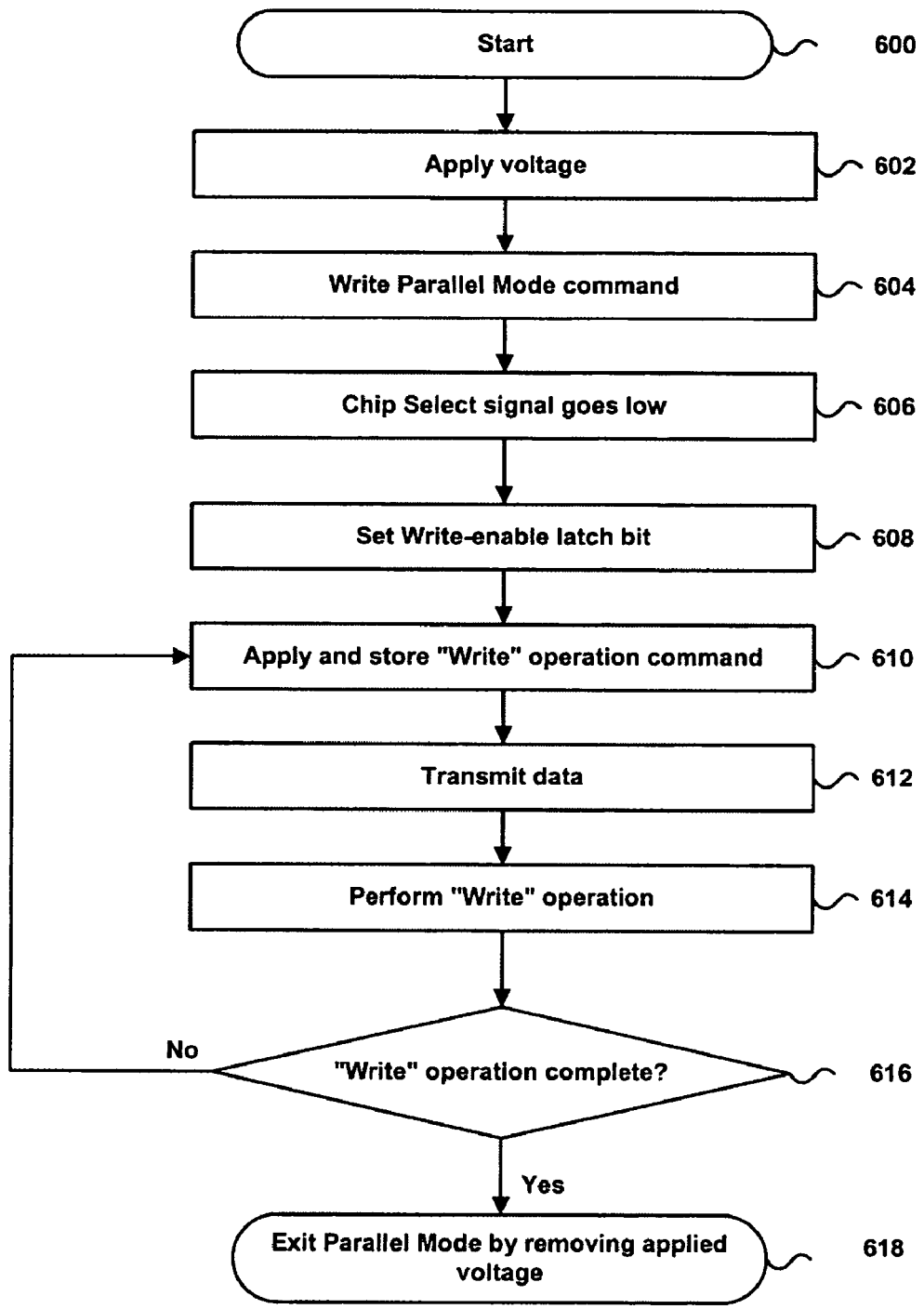
FIGS. 6A and 6B are flowcharts showing a method of transmitting data into or out of a serial flash memory device consistent with the present invention.

FIG. 6A is a flowchart illustrating a method of writing data in the parallel mode into serial peripheral interface flash memory device 400 consistent with the present invention. The process begins (step 600) and a voltage is applied to input voltage terminal 404 (step 602). A parallel mode command is applied to serial input terminal 416 and stored in data buffer 506 (step 604). Control logic 502 interprets the parallel mode command and sets an internal parallel mode status bit in status register 516. When externally applied chip select signal CS goes to a low logic level (step 606), and a write enable command is applied, control logic 502 enables a write-enable latch bit to be set in status register 516, enabling the writing of data in parallel to memory array 508 (step 608). A "Write" operation command is applied to serial input terminal 416 and stored in data buffer 506 (step 610) and data is transmitted through dummy input/output terminals 418 and serial output terminal 412 (step 612) into input/output shift register 504, loaded into data buffer 506, assigned a write address from address register 510 and written into memory array 508 (step 614).

Still referring to FIG. 6A, if the write operation is complete (step 616), the serial peripheral interface flash memory device 400 will remain in parallel mode as long as voltage is applied to voltage terminal 404 (step 618). If the operation has not been completed (step 616), the operation command will again be transmitted (step 610) to continue the operation until the selected operation is complete.

Figure 6B:
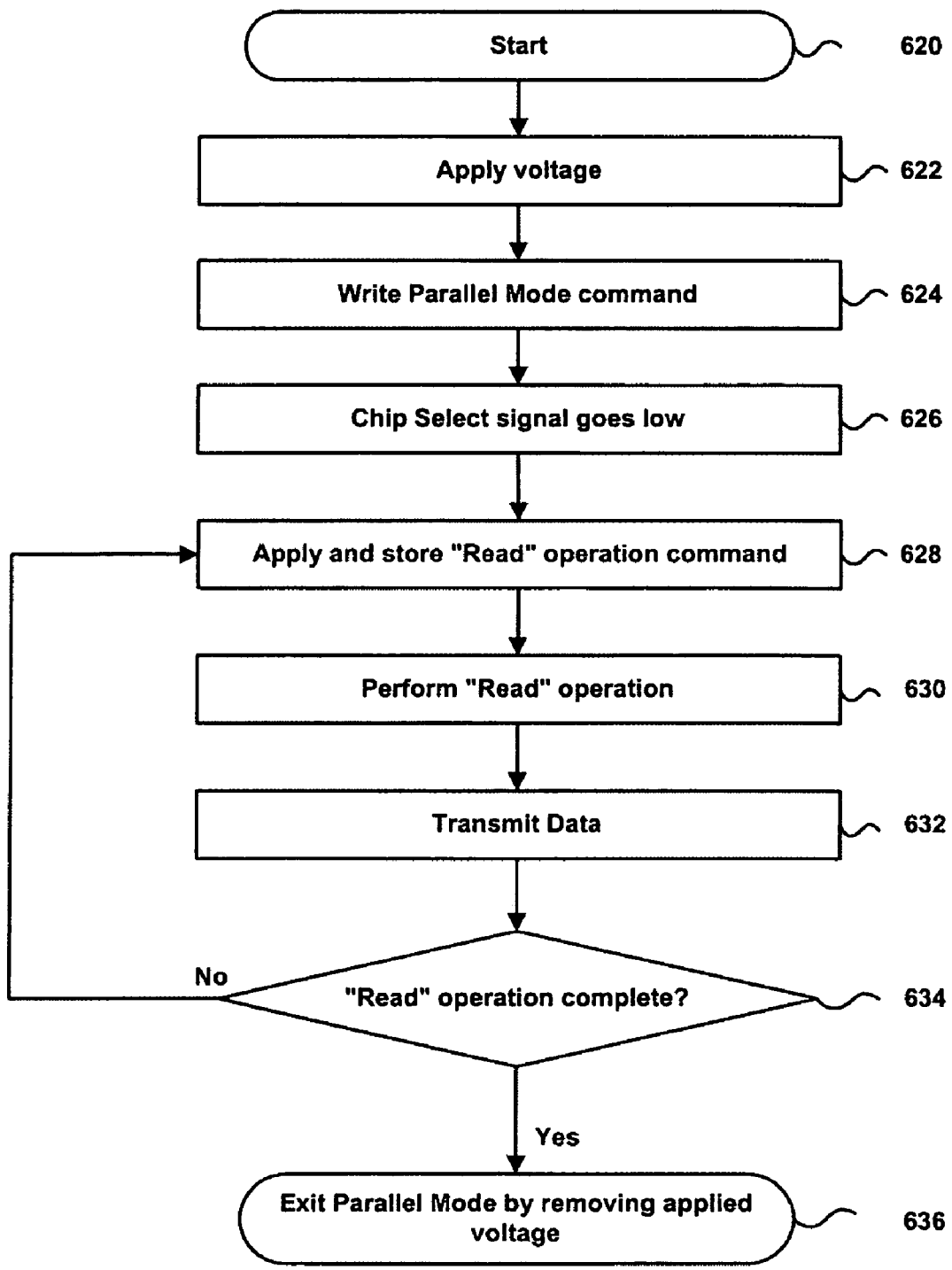

FIG. 6B is a flowchart illustrating a method of reading data in the parallel mode out of serial peripheral interface flash memory device 400, consistent with the present invention. The process begins (step 620) and a voltage is applied to input voltage terminal 404 (step 622). A parallel mode command is applied to serial input terminal 416 and stored in data buffer 506 (step 624). Control logic 502 interprets the parallel mode command such that the internal parallel mode status bit is set. When externally applied chip select signal CS goes to a low logic level (step 626), a "Read" command is applied to serial input terminal 416 and stored in data buffer 506 (step 628). Control logic 502 interprets the "Read" command and X-decoder 512 and Y-decoder 514 determine the location of the data to be read from memory array 508. Data is read from memory array 508 (step 630), output to data buffer 506, and transferred to input/output shift register, from which the data is output through dummy input/output terminals 418 and serial output terminal 412 (step 632).

Still referring to FIG. 6B, if the read operation is complete (step 634), the serial peripheral interface flash memory device 400 will remain in parallel mode as long as voltage is applied to voltage terminal 404 (step 636). If the read operation has not been completed (step 634), the operation command will again be transmitted (step 628) to continue the operation until the selected operation is complete.

Figure 7:
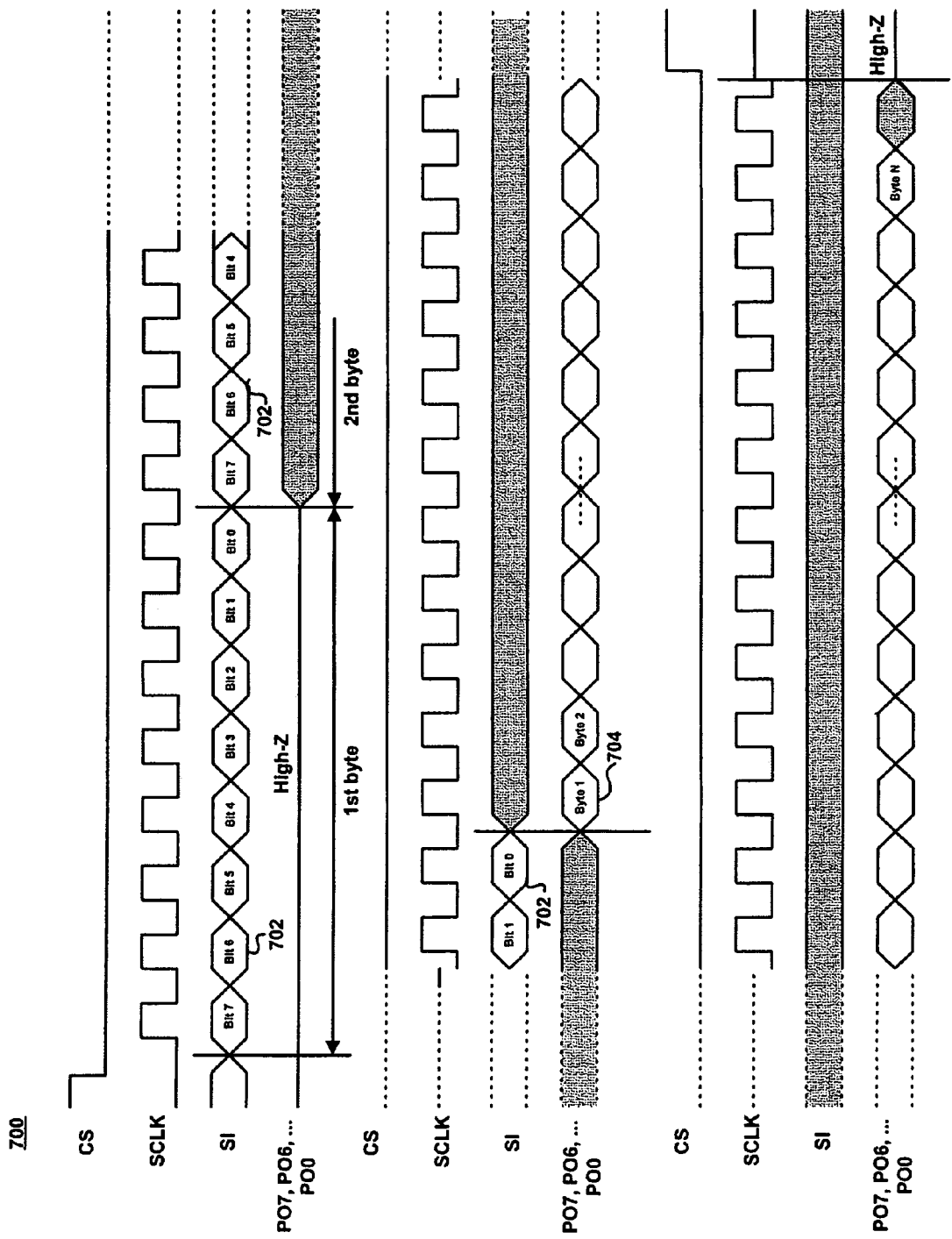
FIG. 7 shows a set of timing waveforms associated with a writing operation of a serial flash memory device consistent with the present invention.

FIG. 7 illustrates a set of timing waveforms 700 associated with a write operation of serial peripheral interface flash memory device 400 consistent with an embodiment of the present invention. The timing waveforms illustrate the waveforms associated with chip select signal CS, serial clock signal SCLK, serial input signal SI and the signal associated with parallel transmission of data on terminals PO0-PO7. The write operation commences when chip select signal CS is driven to a low logic state. Until a parallel mode command is written, dummy input/output terminals 418 and serial output 412, represented by the signal associated with the parallel transmission of data PO0-PO7, has a high impedance. Command bits 702 are transmitted through serial input terminal 416 at a rate of one bit per cycle of serial clock signal SCLK. Command bits 702 may indicate that an operation will be performed in parallel mode, and may further indicate the operation to be performed. Command bits 702 are transmitted into input/output shift register 504 and transferred to data buffer 506. Data 704 is transferred through the plurality of dummy input/output terminals 418 and serial output terminal 412 at a rate of one byte per cycle of serial clock signal SCLK, until the completion of a write operation is indicated by the chip select returning to a high logic level.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of operating a serial peripheral interface flash memory device, comprising:
    applying a parallel mode command to a first pin operatively coupled to an input/output interface of the memory device to cause the device to operate in a parallel data transmission mode;
    applying a chip select signal to a second pin of the memory device to enable operation in response to the parallel mode command;
    applying a serial clock signal to a third pin of the memory device;
    applying one of a read command and a write command to the first pin; and
    transmitting data in parallel on a fourth pin and additional pins, operatively coupled to the input/output interface, at a frequency corresponding to the serial clock signal, wherein data is transmitted only on the fourth pin and at the frequency when the device operates in a serial mode.

2. The method according to claim 1, further including setting a write-enable latch bit in a status register of the serial peripheral interface flash memory device if the write command is applied to the first pin.

3. The method according to claim 1, further including applying a voltage to a fifth pin of the serial peripheral interface flash memory device to enable operation in the parallel mode; and
    removing the applied voltage from the fifth pin of the serial peripheral interface flash memory device to exit the parallel mode.

4. The method according to claim 1 further including providing the memory device to have seven of the additional pins.

5. The method according to claim 1 further including providing the memory device to include a nonvolatile memory array operatively coupled to the input/output interface.

6. A semiconductor memory device comprising:
    an input/output interface;

a serial data transmission input terminal, operably coupled to the input/output interface, for receiving a parallel mode command;

a clock signal input terminal for receiving a serial clock signal;

a serial data transmission terminal, operably coupled to the input/output interface, for serving as a sole data transmission pin in a serial mode for serially transmitting data at a frequency determined by the serial clock signal;

a chip select input terminal for receiving a chip select signal to enable operation in response to the parallel mode command;

a plurality of dummy input/output terminals, operably connected in parallel to the input/output interface, for transmitting data in the parallel mode in parallel with data being transmitted on the serial data transmission terminal at the frequency determined by the serial clock signal.

7. The semiconductor memory device according to claim 6, further comprising:

a memory array operably coupled to the input/output interface.

8. The semiconductor memory device according to claim 7, wherein data can be read from the memory array through the serial data transmission terminal at a rate of one bit per cycle of the serial clock signal in the serial mode.

9. The semiconductor memory device according to claim 7, wherein data can be written to the memory array through the serial data transmission input terminal at a rate of one bit per cycle of the serial clock signal in the serial mode.

10. The semiconductor memory device according to claim 7, wherein data read from the memory array can be transmitted in parallel through the plurality of dummy input/output terminals and the serial data transmission terminal at the frequency according to the serial clock signal.

11. The semiconductor memory device according to claim 7, wherein data can be transmitted in parallel through the plurality of dummy input/output terminals and the serial data transmission terminal, for writing into the memory array, at the frequency determined by the serial clock signal.

12. A serial peripheral interface flash memory integrated circuit device comprising:

a serial data transmission input terminal, for receiving a data or command input;

a clock signal input terminal for receiving a serial clock signal;

a serial data transmission terminal, for serving as a sole data transmission pin in a serial mode for serially transmitting data at a frequency determined by the serial clock signal;

a chip select input terminal for receiving a chip select signal;

at least one voltage input terminal for receiving an applied voltage;

a ground terminal for grounding the device; and a plurality of dummy input/output terminals for transmitting data in a parallel mode in parallel with data being transmitted on the serial data transmission terminal at the frequency determined by the serial clock signal.

* * * * *